United States Patent [19]

Awaji et al.

[11] Patent Number: 5,034,374
[45] Date of Patent: Jul. 23, 1991

[54] METHOD OF PRODUCING HIGH TEMPERATURE SUPERCONDUCTOR JOSEPHSON ELEMENT

[75] Inventors: Naoki Awaji, Tsukuba; Yoshio Kikuchi, Yashio, both of Japan

[73] Assignee: Fujitsu Limited, Kawasaki, Japan

[21] Appl. No.: 365,154

[22] Filed: Jun. 12, 1989

[30] Foreign Application Priority Data

Jun. 13, 1988 [JP] Japan .................. 63-146517
Jan. 24, 1989 [JP] Japan .................. 1-013109

[51] Int. Cl.$^5$ .............................................. B05D 5/12
[52] U.S. Cl. ........................................ 505/1; 505/702; 505/701; 505/731; 427/62; 427/63; 357/5
[58] Field of Search ................ 505/1, 702, 731, 701; 427/62, 63; 357/5; 204/192.24

[56] References Cited

FOREIGN PATENT DOCUMENTS 64-38916 2/1989 Japan .
64-38917 2/1989 Japan .

OTHER PUBLICATIONS

Severin et al, "Superconducting YBa$_2$Cu$_3$O$_x$ thi layers by solid state diffusion," Mat. Res. Bull., vol. 23 (1988) pp. 707–717.

Nakao et al, "Magnetron Sputtering of B$_1$-Ca-S-R-Cu-O thin films with supercondcuting above 80k", Jpn. J. Appl. Phys. vol. 27(3) Mar. 1988 L 378-380.

Hakuraku et al, "Superconducting thin films of Bi-Pb-Sr-CA-Cu-O by dc Magnetron Sputtering from a Single Target", Jpn. J. Appl. Phys. vol. 27(11 Nov. 1988 pp. 2091-2093.

Primary Examiner—Shrive Beck
Assistant Examiner—Roy V. King
Attorney, Agent, or Firm—Armstrong, Nikaido, Marmelstein, Kubovcik, & Murray

[57] ABSTRACT

A method of producing a high temperature superconductor Josephson element for an electronic device or a photodetector comprising the steps of: forming a lower ceramic superconductor film on a substrate; forming an upper ceramic superconductor of a different system ceramic from that of the lower ceramic superconductor film on a portion of the lower ceramic superconductor and on the substrate; and forming an insulating layer (tunnel barrier) between the lower and upper ceramic superconductor films by an interdiffusion therebetween.

17 Claims, 6 Drawing Sheets

Fig. IIA
(PRIOR ART)
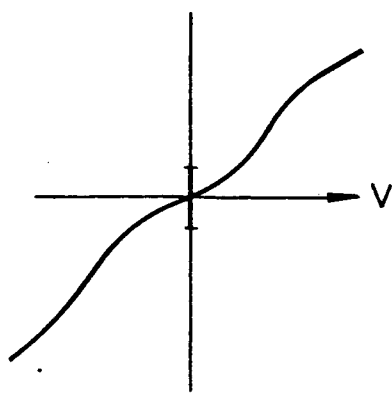
Fig. IIB
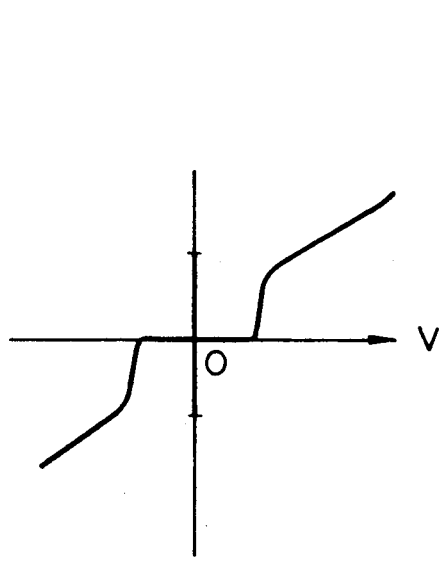
Fig. 12
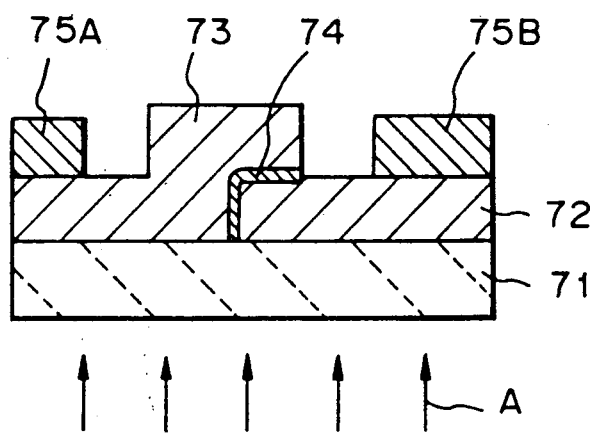

METHOD OF PRODUCING HIGH TEMPERATURE SUPERCONDUCTOR JOSEPHSON ELEMENT

BACKGROUND OF THE INVENTION

1. Field of the Invention

The present invention relates to a ceramic (oxide) high temperature superconductor material, and more particularly, to a method of producing a Josephson element by using the ceramic superconductor material.

2. Description of the Related Art

The research into and development of ceramic high temperature superconductors is progressing rapidly, and this R&D has found that, when a ceramic superconductor material is used for a Josephson element of electronic devices or photodetectors, a high quality tunnel junction must be formed (Josephson junction).

As shown in FIG. 1, a conventional Josephson element having a superconductor-insulator-superconductor (SIS) tunnel junction structure comprises a substrate 1; a lower superconductor thin film 2 of, e.g., Nb or Pb; an insulator film 3 of, e.g., $Al_2O_3$, MgO, $SiO_2$ or oxide of Nb or Pb; an upper superconductor thin film 4 of, e.g., Nb or Pb; and terminal electrodes 5A and 5B of, e.g., Au, Ag. The lower superconductor thin film 2 is formed on the substrate 1 by a vapor deposition process or a sputtering process; the insulator film 3 having a thickness of less than 10 nm, to obtain the tunneling effect, is formed on the thin film 2 by a sputtering process or an oxidation process; and the upper superconductor thin film 4 is formed on the insulator film 3 by the vapor deposition process or the sputtering process used for the lower thin film 2. The Josephson element is used for an electronic device and a photodetector operating under an ultra low temperature of liquid helium (He).

When the metal material of the lower and upper superconductor thin films is replaced with a ceramic (oxide) superconductor material, a rough surface of the lower ceramic superconductor thin film causes pin-holes in the insulator film, which is several tens of nanometers thick and is made of MgO, $Al_2O_3$ or $SiO_2$. The pin-holes cause a leakage current to flow through the insulator film (i.e., a tunnel barrier), but if the insulator film is made thicker, to prevent the formation of pin-holes, the thicker film lowers the junction properties. The ceramic superconductor thin film can not be subjected to a surface oxidation treatment for the formation of the oxide film of the tunnel barrier applied on the metal material, but it is possible to treat the surface of the ceramic superconductor thin film with a $CF_4$ gas plasma, to form the insulator film of fluoride. Nevertheless, such a fluoride insulator film still suffers from pin-holes formed therein. Where the Josephson element comprising the lower and upper ceramic superconductor films and the insulator film therebetween having pin-holes, as mentioned above, is used as a photodetector (photo-switching element), the photodetector can not realize a trouble-free operation, e.g., infrared rays can not be detected thereby, due to the flow of the leakage current.

Therefore, a Josephson element comprises the lower metal (Nb or Pb) superconductor thin layer and the upper ceramic superconductor. But, when used for the metal superconductor thin layer, the Josephson element must be cooled with liquid He, which invalidates the major advantage of using a ceramic superconductor material, (namely, use of liquid nitrogen ($N_2$) instead of liquid He, or coolant not required).

SUMMARY OF THE INVENTION

An object of the present invention is to provide a of producing a Josephson element composed of lower and upper ceramic superconductor thin films, and an insulator film therebetween not having pin-holes.

Another object of the present invention is to provide a method of filling pin-holes in an insulating film of a tunnel barrier with a ceramic insulating layer.

These and other objects of the present invention are obtained by providing a method of producing a high temperature superconductor Josephson element comprising the steps of: forming a lower ceramic superconductor film on a substrate; forming an upper ceramic superconductor of a different system ceramic from that of the lower ceramic superconductor film on a portion of the lower ceramic superconductor and on the substrate; and forming an insulating layer between the lower and upper ceramic superconductor films by an interdiffusion therebetween.

BRIEF DESCRIPTION OF THE DRAWINGS

The present invention will be more apparent from the description of the preferred embodiments set forth below, with reference to the accompanying drawings.

FIG. 11A is a graph showing the dc I-V characteristic of the element of FIG. 10A;

FIG. 11B is a graph showing the dc I-V characteristic of the element of FIG. 10B; and FIG. 12 is a schematic sectional view of a photodetector of a Josephson element.

DESCRIPTION OF THE PREFERRED EMBODIMENTS

Figure 1:
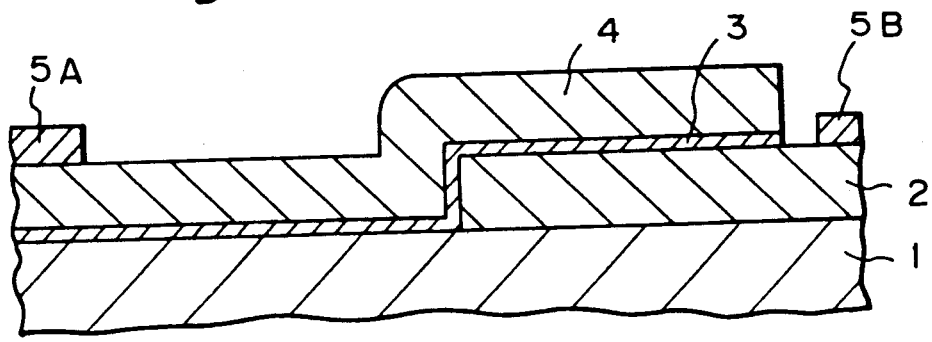
FIG. 1 is a schematic sectional view of a Josephson element of a prior art.

The present inventors found that, when a heterojunction is formed with two ceramic high temperature superconductor materials having different composition systems, the junction (contacting) portions are interdiffused to form an insulating layer, based on the following common knowledge.

A. Since the ceramic high temperature superconductor is a compound, where the composition ratio thereof deviates from a suitable stoichiometric ratio, a crystalline structure thereof is disturbed and the superconductivity thereof is lost; and B. Ceramic high temperature superconductor materials having various composition systems exist, for example:

Bi—Pb—Ba—O system;
Bi—K—Ba—O system;
La—M—Cu—O system (wherein M=Ba, Sr, Ca);
Y—Ba—Cu—O system (wherein Y=Y, rare-earth element except Ce, Pr, Tb);
Bi—Sr—Ca—Cu—O system; and
Tl—Ba—Ca—Cu—O system.

The present inventors then found that the insulating layer formed by the interdiffusion served as a tunnel barrier, and thus completed the present invention based on the above findings.

The insulating layer between the lower and upper ceramic high temperature superconductor films can be formed by the interdiffusion of the different ceramic superconductors, under the following procedure A or B:

A: When the upper ceramic superconductor film is formed, the substrate is heated at a temperature at which a crystallization of the upper film and the interdiffusion occur simultaneously;

B: The upper film is deposited in an amorphous state, while heating the substrate to a temperature lower than the crystallization temperature or without heating the substrate, and then the substrate with the upper film is heated to the crystallization and interdiffusion temperature. In this case, the lower ceramic high temperature superconductor film also may be deposited in an amorphous state, and thus the amorphous lower and upper films can be simultaneously crystallized by the heat-treatment.

It is possible to control the thickness of the insulating layer by controlling the temperature and time of the heat-treatment, and in accordance with the above-mentioned procedures, an insulating layer having a thickness of less than 10 nm can be easily and accurately formed.

Preferably, the substrate is made of MgO, $SrTiO_3$, sapphire or YSZ (Y stabilized $ZrO_2$) which have a single crystalline structure.

Also preferably, the following materials, for example, are used as the ceramic high temperature superconductor films:

---

$BiPb_{1-x}Ba_xO_3$;
$BiK_xBa_{1-x}O_3$;
$(La_{1-x}M_x)_2CuO_4$, wherein M = Ba, Sr, Ca;
$YBa_2Cu_3O_{7-y}$, wherein Y = Y, rare-earth element except Ce, Pr, Tb;
$(BiO)_2Sr_2Ca_{n-1}CuO_{2n+2}$, wherein n = 1 to 3;
$(TlO)_2Ba_2Ca_{n-1}Cu_nO_{2n+2}$, wherein n = 1 to 3; and
$(TlO)Ba_2Ca_{n-1}Cu_nO_{2n+2}$, wherein n = 1 to 5.

---

For the upper ceramic superconductor film, preferably a ceramic superconductor material having a lower crystallization temperature than that of another ceramic superconductor material for the lower (underlying) ceramic superconductor film is used, as this prevents a lowering of the superconductive properties of the lower superconductor film upon crystallization of the upper superconductor film. This also can be applied for a multilayer structure Josephson element comprising three or more ceramic high temperature superconductor films.

The above-mentioned and other ceramic superconductor films can be deposited on the substrate by a suitable conventional method, for example, a vacuum evaporation method, a sputtering method, a chemical vapor deposition (CVD) method, and a molecular beam epitaxy (MBE) method.

Where the Bi—Sr—Ca—Cu—O system ceramic superconductor is used for the upper ceramic superconductor films, to form the insulating layer at the heterojunction region of the upper superconductor film and the lower superconductor film of another ceramic system material, preferably Pb is added to the Bi—Sr—Ca—Cu—O system ceramic material during the upper film deposition. In this case, preferably an oxygen partial pressure of a crystallization atmosphere is reduced to less than one tenth of the atmospheric pressure. This addition of Pb causes the crystallization temperature to become lower than that of the Bi—Sr—Ca—Cu—O system ceramic superconductor film to which the Pb is not added. The combination of the Pb addition and reduction of the oxygen partial pressure causes a further lowering of the crystallization temperature. For example, a conventional Bi—Sr—Ca—Cu—O system ceramic superconductor material has a crystallization temperature of about 850° C. but the Bi—Sr—Ca—Cu—O system ceramic to which Pb is added (e.g., $Bi_{0.8}Pb_{0.2}Sr_2Ca_1Cu_2O_x$) has a crystallization temperature of about 820° C. Namely, the crystallization temperature is reduced by about 30° C. by adding Pb. When the oxygen partial pressure of the atmosphere at the crystallization annealing is also reduced, for example, a ratio of oxygen to an inert gas (Ar) of the atmosphere is 1/10 to 1/100, preferably 1/50 to 1/100, compared with the conventional ratio of 1/10, the crystallization temperature is further lowered by several tens of degrees centigrade. The combination of the above-mentioned treatments reduces the crystallization temperature to 800° C. or less, preferably 750 to 700° C., and this reduction of the crystallization temperature of the upper ceramic superconductor film allows a more accurate control of the interdiffusion, i.e., the insulating layer thickness, and thus the formation of the insulating layer can be controlled to a relatively thin thickness of several nanometers or less, and accordingly, good tunnel junction properties can be obtained. Note, it is also possible to accurately form an insulating layer having a relatively thick thickness.

When the insulating layer is used as a tunnel barrier of the Josephson element, it has a thickness of from 3 to 10 nm, but when the insulating layer is used as a proximity-effect layer of the Josephson element, it has a thickness of from 50 to 100 nm.

According to an embodiment of the present invention, a method of producing a high temperature superconductor Josephson element comprising the steps of: forming a lower ceramic superconductor film on a substrate; forming a barrier layer which has pin-holes and is of a material selected from the group consisting of an insulator, a semiconductor, and metal, on the lower ceramic superconductor film; forming an upper ceramic superconductor of a different system ceramic from that of the lower ceramic superconductor film on the barrier layer and on the substrate; and forming an insulating layer between the lower and upper ceramic superconductor films by an interdiffusion therebetween at the pin-holes. In this case, the upper ceramic film comes into contact with the lower ceramic film at the pin-holes formed in the barrier layer and an interdiffusion therebetween occurs to form insulating layer portions filling the pin-holes. The filling of the pin-holes with the formed insulating portions not only avoids the necessity to increase the barrier layer thickness, but also provides a good tunnel barrier layer having a thinnest possible thickness.

The high temperature superconductor Josephson element produced in accordance with the method of the present invention can be used not only as an electronic device, such as switching device, but also as a photodetector in which the substrate is transparent.

Figure 2:
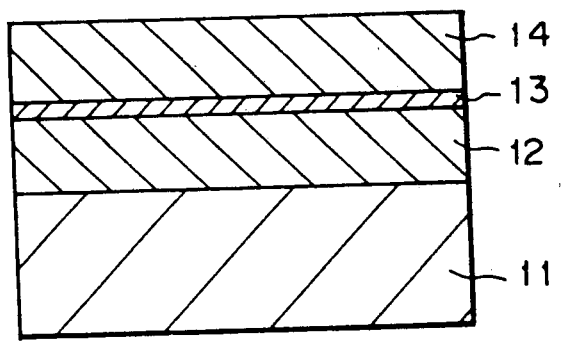
FIG. 2 is a schematic sectional view of a main portion of a Josephson element produced in accordance with a method of the present invention.

Referring to FIG. 2, a principle of present invention will be briefly explained. First, a lower ceramic superconductor film 12 and an upper ceramic superconductor film 14 are sequentially deposited on a substrate 11. Note, the ceramic system material of the film 12 is different from that of the film 14. The substrate 11 is then heated at a crystallization temperature of the film 14, during the deposition of the film 14 (or in an annealing step after the deposition), so that an interdiffusion of the contacting portions of the films 12 and 14 occurs due to the heating (to about 600° C. or more), and as a result, the contacting portions have chemical composition ratios deviating from suitable stoichiometric ratios of the superconductor and have disturbed crystalline structures. Namely, these contacting portions have no superconductivity and are changed into an insulating layer 13 serving as a tunnel barrier.

Referring to FIGS. 3A to 3C, 4, 5, and 6, a method of producing a high temperature superconductor Josephson element in accordance with a preferred embodiment of the present invention is explained.

Figure 4:
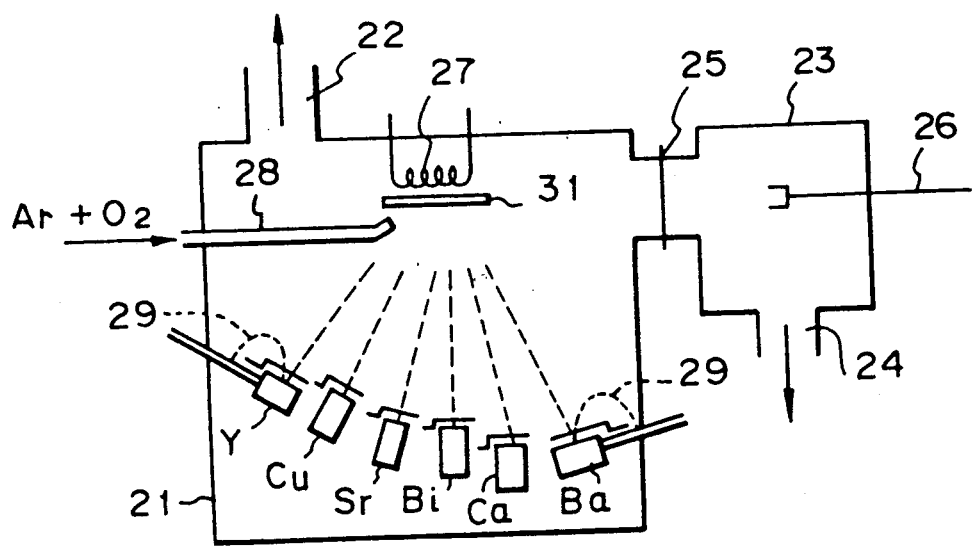
FIG. 4 is a schematic view of a vacuum evaporation apparatus.
Figure 3A:
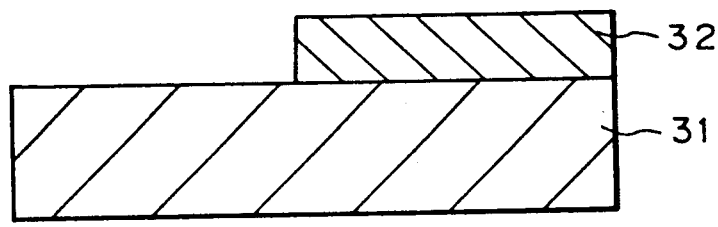
FIGS. 3A to 3C are schematic sectional views of a Josephson element in various stages of production according to the method of the present invention.
Figure 5:
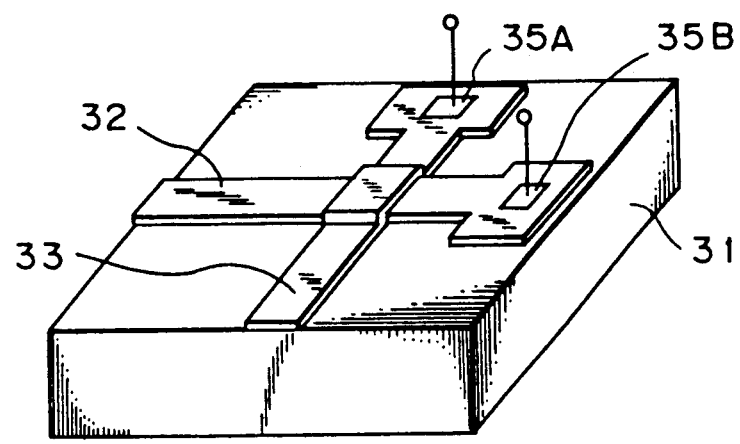
FIG. 5 is a perspective view of a Josephson element.

As shown in FIG. 3A, a substrate 31 is prepared from a (100) MgO single crystal (or a (100) or (110) $SrTiO_3$ single crystal), and a lower ceramic superconductor film 32 having a first composition of Y—Ba—Cu—O system is deposited on the substrate 31 by a vacuum evaporation apparatus shown in FIG. 4; the lower ceramic superconductor film 32 is patterned by a lithography technique using an etching solution of hydrochloric acid (or phosphoric acid), as shown in FIG. 5; and an upper ceramic superconductor film 33 having a second composition of Bi—Sr—Ca—Cu—O system and a predetermined pattern shown in FIG. 5 is deposited on the lower ceramic film 32 and the substrate by the vacuum evaporation apparatus of FIG. 4, using a suitable metal mask having patterned slits.

The vacuum evaporation apparatus (FIG. 4) comprises a reacting chamber 21 provided with an exhaust pipe 22, and a load-lock chamber 23 provided with an exhaust pipe 24. These exhaust pipes 22 and 24 are connected to vacuum pump systems (not shown) respectively. The chambers 21 and 23 are communicated through a gate valve 25. The apparatus is provided with a manipulator 26 for transferring the substrate 31 from the load-lock chamber 23 to the reacting chamber 22, and vice versa. The reacting chamber 22 contains a heater 27 for heating the substrate 31, an inlet pipe 28 for introducing an atmospheric gas, and source cells for evaporating Y, Ba, Cu, Sr, Bi and Ca. Each of the evaporation sources is provided with a suitable heating means (electron-beam gun, resistance heater or induction heating means). The electron-beam gun is preferably used for high melting-point metal, such as Y and Ba. In this case, the Y source cell and Ba source cell are provided with the electron-beam guns for generating electron-beams 29, respectively. The Cu, Sr, Bi and Ca source cells are provided with the resistance heaters (not shown), respectively.

The lower ceramic film 32 is formed under the following conditions: the reacting chamber 21 is evacuated to $10^{-6}$ Torr; the substrate 31 is heated and maintained at 700° C. by the heater 27; and oxygen ($O_2$) is fed to a point in the vicinity of the substrate 31, through the inlet pipe 28, to form an oxygen-containing atmosphere at $10^{-4}$ to $10^{-5}$ Torr near the substrate; and Y vapor, Ba vapor, and Cu vapor are generated in the corresponding source cells and impinged on the heated substrate 31. The crystallized $YBa_2Cu_3O_x$ is deposited at a deposition rate of 0.1 nm/sec to form the lower film 32 having a thickness of 200 nm. The formation of the upper ceramic film 33 is carried out under the same conditions as above-mentioned, except that Bi vapor, Sr vapor, Ca vapor, and Cu vapor are generated in the corresponding source cells, and as a result, the crystallized $BiSrCaCu_2O_x$ is deposited at a deposition rate of 0.1 nm/sec to form the upper film 33 having a thickness of 200 nm. During the upper film formation, the contacting portions of the films 32 and 33 are interdiffused to form the insulating layer 34 (FIG. 3B) having a thickness of about 10 nm.

To control the thickness of the insulating layer (channel barrier) 34, the deposition time (deposition rate) and/or the substrate temperature (crystallization temperature) are varied, i.e., a prolonging of the deposition time and/or a raising of the substrate temperature will provide a thicker insulating layer 34.

Figure 3B:
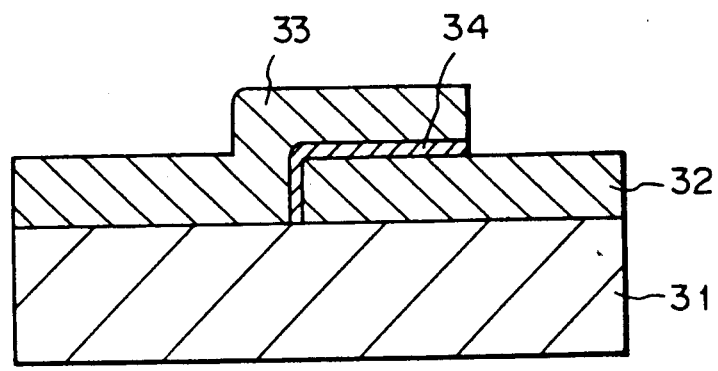
Figure 3C:
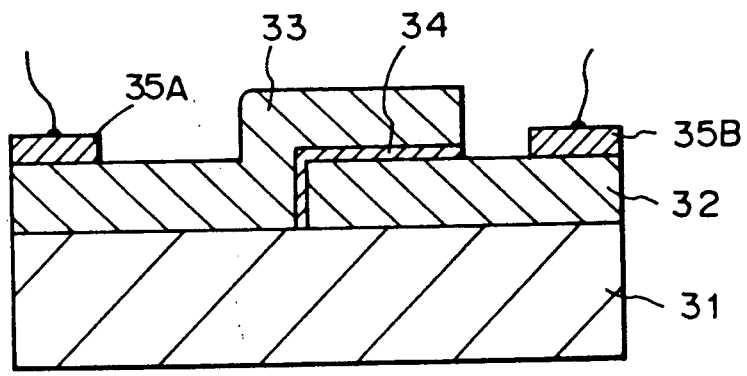

Next, as shown in FIGS. 3C and 5, two electrode pads 35A and 35B of, e.g., gold (Au), are formed on the lower and upper ceramic superconductor films 32 and 33, respectively.

Figure 6:
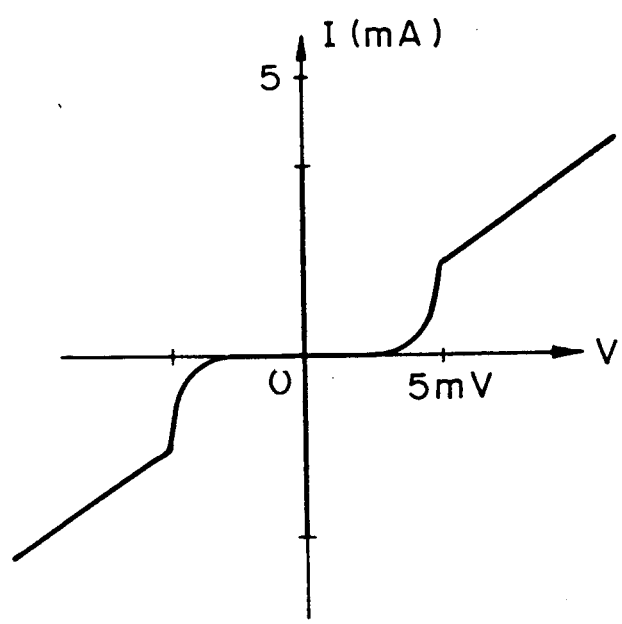
FIG. 6 is a graph showing the dc current-voltage (I-V) characteristic of the Josephson element of FIG. 5.

Accordingly, the obtained Josephson element has the dc current-voltage (I-V) characteristic (at 77 K) shown in FIG. 6, and as is obvious from FIG. 6, the Josephson element has a good tunnel junction.

Figure 7:
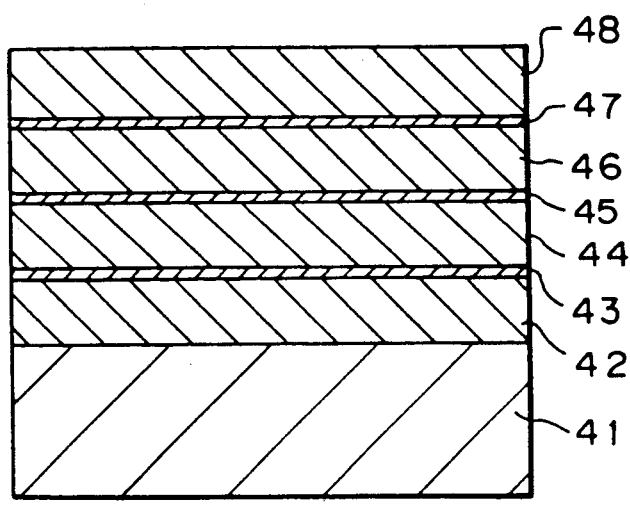
FIG. 7 is a schematic sectional view of a Josephson element including tunnel barriers of insulating layers.

Referring to FIG. 7, a high temperature superconductor Josephson element having multilayer tunnel barriers can be produced in accordance with a second embodiment of the present invention.

A first ceramic superconductor film 42, a second ceramic superconductor film 44, a third ceramic superconductor film 46, and a fourth ceramic superconductor film 48 are deposited on a substrate 41 of, e.g., (100) MgO single crystal, by a vacuum evaporation method using, e.g., the above-mentioned apparatus. For example, the first and third ceramic films 42 and 46 are made of Y—Ba—Cu—O system material, and the second and fourth ceramic films 44 and 48 are made of Bi—Sr—Ca—Cu—O system material, i.e., a ceramic system of one of the films 42, 44, 46 and 48 is different from that of the adjacent films. Each of the ceramic films is formed under conditions similar to those mentioned above, and thus, during the deposition of the upper ceramic film, each of insulating layers 43, 45, and 47 is formed by the interdiffusion between the upper ceramic film and the underlying ceramic film. The thickness of each of the insulating layers 43, 45, and 47 can be controlled by varying the substrate temperature (crystallization temperature) and deposition time (deposition rate) for each of the ceramic films 44, 46, and 48, and therefore, it is possible to form a superlattice structure which comprises the ceramic superconductor films and the insulating layers (i.e., at least two tunnel barriers) in the Josephson element.

Where at least three ceramic superconductor films are formed alternately using two ceramic system materials, the substrate temperatures (deposition temperatures) are maintained at a suitable constant temperature. It is possible to gradually lower the substrate heating temperature for the later-formed ceramic film, compared with that of the under-lying ceramic film, by using different ceramic system materials for all of the ceramic superconductor films in which a crystallization temperature of the later-formed ceramic film is lower than that of the previous ceramic film.

According to a third embodiment of the present invention, a greater control of the lowering of a crystallization temperature of a Bi—Sr—Ca—Cu—O system for the upper ceramic superconductor film of a Josephson element, when forming an insulating layer of the tunnel barrier, can be obtained.

Figure 8:
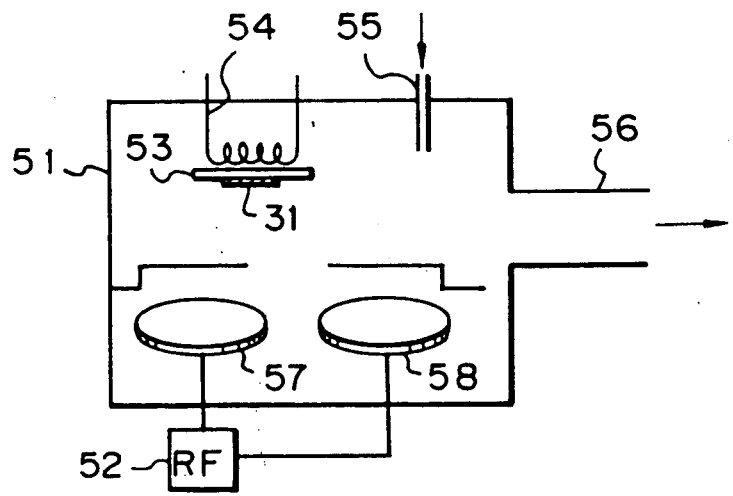
FIG. 8 is a schematic view of a sputtering apparatus.

A high temperature superconductor Josephson element comprising a Y—Ba—Cu—O system lower ceramic superconductor film, a Pb-added Bi—Sr—Ca—Cu—O system upper ceramic superconductor film, and an insulating layer formed between the lower and upper films, is produced in a manner similar to that of the first embodiment, as shown in FIGS. 3A to 3C and FIG. 5, except that the lower and upper ceramic films are deposited by a sputtering apparatus shown in FIG. 8.

The sputtering apparatus shown in FIG. 8 comprises a vacuum chamber 51, an RF power source 52, a holder 53 for a substrate 31, a heater 54 for heating the substrate 31, an inlet pipe 55 for feeding an atmospheric gas (e.g., Ar and $O_2$), and an exhaust pipe 56 connected to a vacuum pump system (not shown). A first sintered target 57 of $YBa_3Cu_4O_x$ and a second sintered target 58 of $Bi_{0.8}Pb_{0.2}Sr_1Ca_1Cu_2O_x$ are set in the chamber 51, and connected to the RF power source 52.

First, the substrate 31 of MgO or $SrTiO_3$ single crystal is set on the holder 53, then the vacuum chamber 51 is evacuated to a very low level and $O_2$ and Ar ($O_2$/Ar=1/1) are fed into the chamber 51 through the inlet pipe 55 to form an oxygen-containing atmosphere at a pressure of $1 \times 10^{-2}$ Torr. Next, the substrate 31 is heated and maintained at about 600° C., and the first target 57 is sputtered to deposit $YBa_2Cu_3O_x$ on the substrate 31 at a deposition rate of 0.015 nm/sec, whereby an amorphous (uncrystallized) $YBa_2Cu_3O_x$ film 32 having a thickness of 200 nm is formed. Then the substrate 31 with the Y—Ba—Cu—O film 32 is annealed under an oxygen atmosphere at 850° C., in an electric furnace, to crystallize the $YBa_2Cu_3O_x$ film, the film 32 is patterned, as shown in FIGS. 3A and 5, by a lithography technique using an etching solution of hydrochloric acid (or phosphoric acid), and thereafter, the substrate 31 is reset on the holder 53, the vacuum chamber 51 is evacuated to a very low level, and $O_2$ and Ar ($O_2$/Ar=1/10) are fed into the chamber 51 in which the atmosphere pressure is $1 \times 10^{-2}$ to $1 \times 10^{-4}$ Torr. The substrate 31 is then heated and maintained at 700° C. and the second target 58 having Pb added thereto is sputtered to deposit $Bi_{0.8}Pb_{0.2}SrCaCu_2O_x$ on the lower film 32 and the substrate 31, through a suitable metal mask having patterned slits, at a deposition rate of 0.05 nm/sec, whereby an amorphous $Bi_{0.8}Pb_{0.2}SrCaCu_2O_x$ upper film 33 having a thickness of 200 nm is formed, as shown in FIGS. 3B and 5. Then the substrate 31 with the amorphous film 33 is annealed under the $O_2$ and Ar atmosphere ($O_2$/Ar=1/10) at 830° C. to crystallize the film 33. During the upper film formation and annealing, an insulating layer 34 (FIG. 3B) having a thickness of about 2 to 3 nm is formed by an interdiffusion of the contacting portions of the low and upper films 32 and 33. The substrate heating (annealing) temperature (830° C.) is made lower than that (850° C.) for the deposition of crystallized $BiSrCaCuO_x$ by sputtering a third sintered target of $BiSrCaCuO_x$ to which Pb has not been added.

As well as the addition of Pb, the oxygen partial pressure of the atmosphere for the upper ceramic film formation is reduced to a ratio of from 1/10 to 1/20 of the atmosphere pressure, so that the substrate annealing temperature (crystallization temperature) can be further lowered to 880° C. at which an amorphous $BiSrCaCuO_x$ without Pb is annealed in air. For example, after the formation of the crystallized $YBa_2Cu_3O_x$ film 32, the substrate 31 is reset on the holder 53, $O_2$ and Ar ($O_2$/Ar=1/13) are fed at a pressure of $1 \times 10^{-4}$ Torr, the substrate 31 is heated at 700° C., and the second target 58 is sputtered to form the amorphous $Bi_{0.8}Pb_{0.2}SrCaCu_2O_x$ upper film 33. Then the amorphous film 33 is crystallized by annealing at 820° C. under the $O_2$ and Ar atmosphere. Namely, in this case, the crystallization temperature of the Bi—Pb—Sr—Ca—Cu—O system ceramic upper film 33 is lowered to 820° C. The lowering of the crystallization temperature (the substrate heating temperature) lowers an interdiffusion rate (i.e., a formation rate of the insulating layer), and thus the thickness of the insulating layer (tunnel barrier) can be accurately controlled (e.g., a thin insulating layer can be formed). The obtained Josephson element has a dc I-V characteristic (at 77 K) similar to that of FIG. 6.

The sputtering apparatus can be replaced by the vacuum evaporation apparatus shown in FIG. 4, or another apparatus such as a CVD apparatus or an MBE apparatus, when depositing the ceramic superconductor material. Furthermore, it is possible to crystallize the upper ceramic film formed on the substrate at a relatively low heating temperature, by an annealing treatment after the deposition step, instead of the above-mentioned in-situ crystallization with heating of the heater for the substrate within the sputtering apparatus.

Referring to FIGS. 9, 10A, 10B, 11A and 11B, a high temperature superconductor Josephson element having an additional insulator layer (barrier) between the lower and upper ceramic superconductor films is produced in accordance with a prior art and a fourth embodiment of the present invention.

Figure 9:
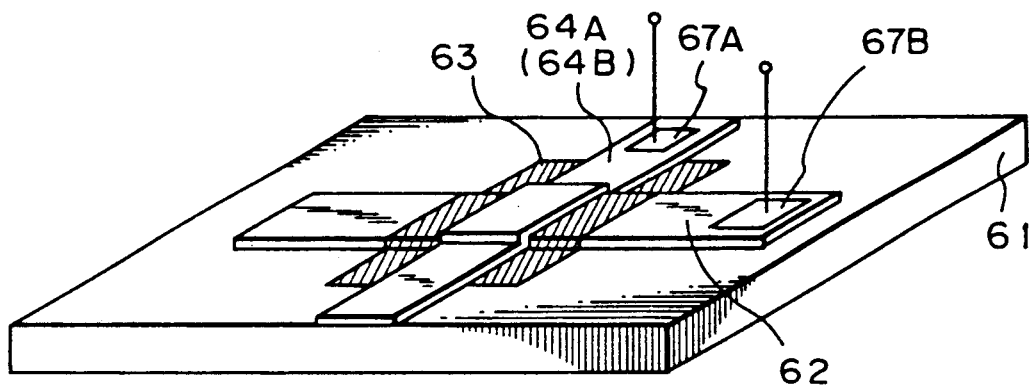
FIG. 9 is a perspective view of a Josephson element including an insulator layer.
Figure 10A:
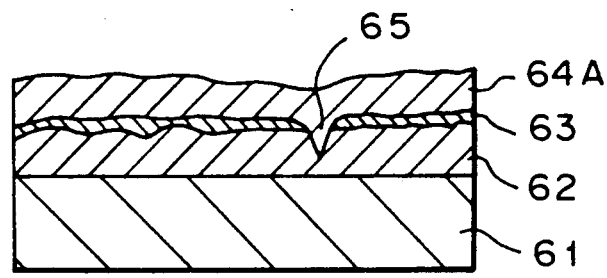
FIG. 10A is a schematic sectional view of the Josephson element of FIG. 9 in which a lower ceramic film material is the same as an upper ceramic film material.
Figure 10B:
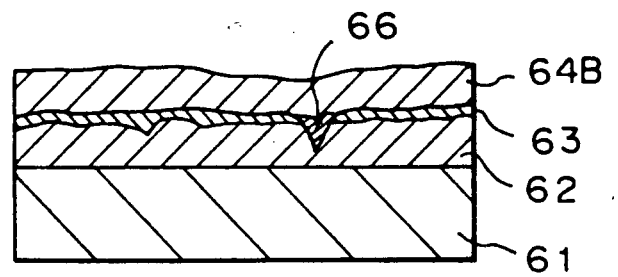
FIG. 10B is a schematic sectional view of the Josephson element of FIG. 9 in which the lower ceramic film material is different from the upper ceramic film material.

A substrate 61 is made of MgO (or $SrTiO_3$, sapphire or YSZ) single crystal, and a lower ceramic superconductor film 62 is deposited on the substrate 61 heated to 600° C. by sputtering a $YBa_2Cu_3O_x$ target, and is crystallized by an annealing treatment at 850° under an oxygen-containing atmosphere. The crystallization of the lower ceramic film 62 may be carried out by heating the substrate 61 to 850° C. during the deposition. The lower ceramic film 62 is patterned as shown in FIG. 9, and then an insulator, such as $Al_2O_3$ and MgO, is deposited on center portions of the lower ceramic film 62 and the substrate 61 by a sputtering method, to form a barrier layer 63 having a thickness of from 1 to 3 nm, as shown in FIGS. 9, 10A and 10B. Instead of the insulator layer, a metal layer having a thickness of from 10 to 100 nm may be formed by a vacuum evaporation of metal, such as gold and silver, or a semiconductor layer having a thickness of from 50 to 100 nm may be formed by a CVD process of a semiconductor such as InGaP and GaAs. The barrier layer 63 has larger dimensions than those of a tunnel barrier of the Josephson element, and has pin-holes 65 (FIG. 10A) due to a rough surface of the lower ceramic film 62. Instead of the deposition of the barrier layer 63, the surface portion of the lower ceramic film 62 may be changed into a fluoride insulating barrier layer by a $CF_4$ plasma treatment, but the fluoride layer also has pin-holes therein.

According to the prior art, an upper ceramic superconductor film 64A (FIG. 10A) of $YBa_2Cu_3O_x$, i.e., the same material as that of the lower ceramic film 62, is deposited by using a sputtering apparatus and a metal mask with patterned slits as shown in FIG. 9 and 10A. Then the upper ceramic film 64A is crystallized by annealing at 850° C. under an oxygen-containing atmosphere. In this case, the pin-holes 65 are filled with the $YBa_2Cu_3O_x$ upper ceramic film 64A, which causes a generation of a leakage current. Next, as shown in FIG. 9, two electrode pads 67A and 67B of, e.g., Au, are formed on the lower and upper ceramic films 64A and 62, respectively. The thus-obtained Josephson element has a dc I-V characteristic (at 77 K) shown in FIG. 11A. As is obvious from FIG. 11A, the tunnel barrier (tunnel junction) of the element has a poor characteristic.

On the other hand, according to the present invention, the upper ceramic superconductor film 64B (FIG. 10B) of $Bi_2Sr_2Ca_2Cu_3O_x$ is deposited by using the sputtering apparatus and the metal mask as shown in FIG. 9 and 10B, and during the deposition, the substrate 61 is heated to 850° C. to crystallize the upper ceramic film 64B having a thickness of 200 nm, and simultaneously, the pin-holes are filled with insulating layer portions 66 formed by an interdiffusion of contacting portions of the lower and upper ceramic films 62 and 64B at the pin-holes. Therefore, the barrier layer 63 and the insulating layer portion 66 filling the pin-holes constitute a tunnel barrier without pin-hole defects. Preferably the upper ceramic film 64B is formed by sputtering a $Bi_{0.8}Pb_{0.2}SrCaCu_{1.5}O_x$ target under an atmosphere of $O_2$ and Ar ($O_2/Ar = 1/13$) at a pressure of $1 \times 10^{-4}$ Torr, and depositing it on the barrier layer 63 and the substrate 61 heated at 800° C. The deposited upper ceramic film 64B is crystallized and fills the pin-holes of the barrier layer 63, so that the lower and upper ceramic films 62 and 64B come into contact with each other through the pin-holes and interdiffuse to form the insulating layer portions 66 filling the pin-holes. Then the two electrode pads 67A and 67B are formed, as shown in FIG. 9. The thus-obtained Josephson element has a tunnel barrier with no pin-hole defects and a dc I-V characteristic (at 77 K) shown in FIG. 11B. As is obvious from FIG. 11B, the tunnel barrier (junction) of the element has a superior characteristic.

Referring to FIG. 12, a photodetector of a Josephson element type produced in accordance with a fifth embodiment of the present invention comprises a transparent substrate 71 of, e.g., an MgO single crystal; a lower $YBa_2Cu_3O_x$ superconductor film 72; an upper $BiSrCaCuO_x$ superconductor film 73; an insulating layer 74 of a tunnel barrier; and electrode pads 75A and 75B of Au. The photodetector is produced in a manner similar to the first embodiment explained with reference to FIGS. 3A to 3C. Taking the use of the photodetector into consideration, the substrate 71 should be transparent, and the insulating layer (barrier) 74 should receive a light A. Preferably, the lower and upper ceramic films have a thickness of from 300 to 500 nm, more preferably 400 nm, respectively. When light falls on the insulating layer (tunnel barrier), through which a superconducting current flows, the superconducting state is disturbed and the superconducting current is reduced. Accordingly, the superconducting current is varied whenever light falls on the photodetector, whereby a quick and stable response of the photodetector can be obtained. The photodetector can detect light over a wide wavelength range, including infrared light.

As mentioned above, according to the present invention, an improved insulating layer of a tunnel barrier can be formed by using two ceramic superconductor films having different ceramic systems (different component systems) at the interface therebetween, and the thickness of the insulating layer can be accurately controlled. The thin insulating layer having a thickness of from 3 to 10 nm serves as a tunnel barrier of a Josephson element, such as an electronic device and a photodetector. It is possible to form the insulating layer having a thickness of from 50 to 100 nm and suitable for a proximity-effect layer of another type of Josephson element also used as an electronic device or photodetector. In the above-mentioned embodiments of the present invention, Y—Ba—Cu—O system and Bi—Sr—Ca—Cu—O system superconductor materials are used, but other ceramic system superconductor materials can be used instead of or in combination with the above-mentioned ceramic system materials.

It will be obvious that the present invention is not restricted to the above-mentioned embodiments and that many modifications thereof are possible for those skilled in the art, without departing from the scope of the present invention.

We claim:

1. A method of producing a high temperature superconductor Josephson element comprising the steps of:
    forming a lower ceramic superconductor film on a substrate;
    forming an upper ceramic superconductor film of a different ceramic system from that of said lower ceramic superconductor film on a portion of said lower ceramic superconductor film on said substrate; and
    forming an insulating layer between said lower and upper ceramic superconductor film by an interdiffusion therebetween by heating at an elevated temperature not higher than the crystallization temperatures of the upper and lower films wherein the ceramic superconductor material is one selected from the group consisting of BiPbBaO; BiKBaO; (LaM) CuO wherein M=Ba, Sr, Ca; YBaCuO wherein Y=Y, rare-earth element except Ce, Pr, Tb; (BiO)SrCaCuO; and (TlO)BaCaCuO.

2. A method according to claim 1, wherein the substrate material is one selected from the group consisting of MgO, $SrTiO_3$, sapphire and YSZ.

3. A method according to claim 1, wherein during the step of forming said upper ceramic superconductor film, said substrate is heated to a temperature at which said interdiffusion will occur.

4. A method according to claim 1, wherein said upper ceramic superconductor film is formed in an amorphous state, and is heated to a temperature at which a crystallization of the upper ceramic film and said interdiffusion will occur.

5. A method according to claim 1, wherein said upper ceramic superconductor film is made of Bi—S- r—Ca—Cu—O system ceramic to which Pb has been added to therein make the crystallization temperature of said upper ceramic film lower than that of the Bi—Sr—Ca—Cu—O system ceramic to which Pb has not been added.

6. A method according to claim 5, wherein an oxygen partial pressure of a crystallization atmosphere is lowered to less than one tenth of the atmospheric pressure.

7. A method according to claim 1, wherein said insulating layer is a tunnel barrier having a thickness of from 3 to 10 nm.

8. A method according to claim 1, wherein said insulating layer is a proximity-effect layer having a thickness of from 50 to 100 nm.

9. A method according to claim 1, further comprising, between the step of forming the lower ceramic superconductor film and the step of forming the upper ceramic superconductor film, steps of forming at least one additional ceramic superconductor film of a different ceramic system from that of the underlying ceramic superconductor wherein ceramic systems of said additional films are different from the ceramic systems of both adjacent films; and forming another insulating layer between said lower and additional ceramic superconductor films by an interdiffusion therebetween caused by heating at said elevated temperature not higher than the crystallization temperatures of the lower and additional films wherein the additional ceramic superconductor material is one selected from the group consisting of BiPbBaO; BiKBaO; (LaM) CuO wherein M=Ba, Sr, Ca; wherein La=Y, Ce, Pr, Tb; (BiO) SrCaCuO; and (TlO) BaCaCuO.

10. A method of producing a high temperature superconductor Josephson element comprising the steps of:
   forming a lower ceramic superconductor film on a substrate;
   forming a barrier layer having pin-holes on said lower superconductor film, said barrier layer being composed of a material selected from the group consisting of an insulator, a semiconductor, and a metal;
   forming an upper ceramic superconductor film of a different ceramic system from that of said lower ceramic superconductor film on said barrier layer and on said substrate; and
   forming an insulating layer between said lower and upper ceramic superconductor film by an interdiffusion therebetween at said pin-holes by heating at an elevated temperature not higher than the crystallization temperature of the lower and upper films wherein the ceramic superconductor material is one selected from the group consisting of BiPbBaO; BiKBaO; (LaM) CuO wherein M=Ba, Sr, Ca; YBaCuO wherein Y=Y, rare-earth element except Ce, Pr, Tb; (BiO)SrCaCuO; and (TlO)-BaCaCuO.

11. A method according to claim 10, wherein the substrate material is one selected from the group consisting of MgO, $SrTiO_3$, sapphire and YSZ.

12. A method according to claim 10, wherein during the step of forming said upper ceramic superconductor film, said substrate is heated to a temperature at which said interdiffusion will occur.

13. A method according to claim 10, wherein said upper ceramic superconductor film is formed in an amorphous state, and is heated to a temperature at which crystallization of the upper ceramic film and said interdiffusion will occur.

14. A method according to claim 10, wherein said upper ceramic superconductor film is made of Bi—Sr—Ca—Cu—O system ceramic to which Pb has been added, to make the crystallization temperature of said upper ceramic film lower than that of the Bi—Sr—Ca—Cu—O system ceramic, to which Pb has not been added.

15. A method according to claim 14, wherein an oxygen partial pressure of a crystallization atmosphere is lowered to less than one tenth of the atmospheric pressure.

16. A method according to claim 10, wherein said barrier layer and insulating layer correspond to a tunnel barrier having a thickness of from 3 to 10 nm.

17. A method according to claim 10, wherein said barrier layer and insulating layer correspond to a proximity-effect layer having a thickness of from 50 to 100 nm.

* * * * *